United States Patent
Fischer et al.

(10) Patent No.: US 7,533,324 B2
(45) Date of Patent: May 12, 2009

(54) SYSTEM, METHOD AND APPARATUS FOR FEC ENCODING AND DECODING

(75) Inventors: Michael J. Fischer, Hamden, CT (US); H. Lewis Wolfgang, Stamford, CT (US); Weimin Fang, Stamford, CT (US)

(73) Assignee: Kencast, Inc., Stamford, CT (US)

( * ) Notice: Subject to any disclaimer, the term of this patent is extended or adjusted under 35 U.S.C. 154(b) by 601 days.

(21) Appl. No.: 11/233,440

(22) Filed: Sep. 22, 2005

(65) Prior Publication Data

US 2006/0064626 A1    Mar. 23, 2006

Related U.S. Application Data

(60) Provisional application No. 60/612,289, filed on Sep. 22, 2004.

(51) Int. Cl.
*H03M 13/00* (2006.01)
(52) U.S. Cl. ..................................... 714/776
(58) Field of Classification Search ................. 714/746, 714/775–776
See application file for complete search history.

(56) References Cited

U.S. PATENT DOCUMENTS

| | | | |
|---|---|---|---|
| 4,718,066 A | 1/1988 | Rogard | 714/751 |
| 4,907,277 A | 3/1990 | Callens et al. | 704/202 |
| 5,485,474 A | 1/1996 | Rabin | 714/762 |
| 5,594,490 A | 1/1997 | Dawson et al. | |
| 5,600,663 A | 2/1997 | Ayanoglu et al. | 714/774 |
| 5,617,541 A | 4/1997 | Albanese et al. | |
| 5,631,907 A | 5/1997 | Guarneri et al. | 370/474 |
| 5,768,533 A | 6/1998 | Ran | |
| 5,790,524 A | 8/1998 | Bennett et al. | 370/244 |
| 5,815,514 A * | 9/1998 | Gray | 714/775 |
| 5,903,574 A * | 5/1999 | Lyons | 714/704 |
| 5,959,974 A | 9/1999 | Badt et al. | 370/233 |
| 6,012,159 A | 1/2000 | Fischer et al. | 714/744 |
| 6,031,818 A | 2/2000 | Lo et al. | |
| 6,052,819 A | 4/2000 | Barker et al. | 714/776 |
| 6,104,757 A | 8/2000 | Rhee | 375/240 |
| 6,141,788 A | 10/2000 | Rosenberg et al. | 714/774 |

(Continued)

OTHER PUBLICATIONS

Michael O. Rabin, "Probabilistic Algorithms in Finite Fields," SIAM J. Comput. vol. 9, No. 2, May 1980 pp. 273-280.

(Continued)

*Primary Examiner*—Shelly A Chase
(74) *Attorney, Agent, or Firm*—Fitzpatrick, Cella, Harper & Scinto

(57) ABSTRACT

A system, method and apparatus are provided for encoding and decoding a source file. The source file is encoded by dividing it into a plurality of shares comprised of a plurality of packets. A bit vector is generated. For at least one share, an FEC packet is generated by XOR'ing a subset of packets from the plurality of packets in the share in accordance with the bit vector. The process of encoding continues until terminated. Once the FEC encoded packets are received, each of the plurality of packets which is not a linear combination of previously received packets is stored into a file. A sequence of XOR operations to perform in-place on the file to reconstruct the source file are generated and performed on the file.

19 Claims, 3 Drawing Sheets

U.S. PATENT DOCUMENTS

| | | | |
|---|---|---|---|
| 6,151,696 | A | 11/2000 | Miller et al. |
| 6,189,039 | B1 | 2/2001 | Harvey et al. |
| 6,249,810 | B1 | 6/2001 | Kiraly |
| 6,272,658 | B1 | 8/2001 | Steele et al. ............... 714/752 |
| 6,289,054 | B1 | 9/2001 | Rhee .................... 375/240.27 |
| 6,307,487 | B1 | 10/2001 | Luby ......................... 341/50 |
| 6,317,462 | B1 | 11/2001 | Boyce ................... 375/240.27 |
| 6,320,520 | B1 | 11/2001 | Luby ......................... 341/50 |
| 6,336,200 | B1 | 1/2002 | Wolfgang .................. 714/752 |
| 6,373,406 | B2 | 4/2002 | Luby ......................... 341/50 |
| 6,411,223 | B1 | 6/2002 | Haken et al. ................. 341/50 |
| 6,445,717 | B1 | 9/2002 | Gibson et al. |
| 6,486,803 | B1 | 11/2002 | Luby et al. .................. 341/50 |
| 6,526,022 | B1 | 2/2003 | Chiu et al. |
| 6,567,929 | B1 | 5/2003 | Bhagavath et al. |
| 6,567,948 | B2 | 5/2003 | Steele et al. |
| 6,570,843 | B1 | 5/2003 | Wolfgang |
| 6,574,795 | B1 | 6/2003 | Carr |
| 6,594,798 | B1 | 7/2003 | Chou et al. |
| 6,606,723 | B2 | 8/2003 | Wolfgang |
| 6,609,223 | B1 | 8/2003 | Wolfgang .................. 714/752 |
| 6,614,366 | B2 | 9/2003 | Luby ......................... 341/50 |
| 6,671,807 | B1 | 12/2003 | Jaisimha et al. |
| 6,701,373 | B1 | 3/2004 | Sakazawa et al. |
| 6,735,634 | B1 | 5/2004 | Geagan, III et al. |
| 6,765,889 | B1 | 7/2004 | Ludwig |
| 6,782,490 | B2 | 8/2004 | Maxemchuk et al. |
| 6,804,244 | B1 | 10/2004 | Anandakumar et al. |
| 7,024,609 | B2 | 4/2006 | Wolfgang et al. |
| 2003/0009718 | A1 | 1/2003 | Wolfgang et al. |
| 2008/0098284 | A1 | 4/2008 | Wolfgang et al. |

OTHER PUBLICATIONS

Michael O Rabin, "Efficient Dispersal of Information for Security, Load Balancing, and Fault Tolerance," Journal of the Assoc. For Computing Machinery vol. 36, No. 2 Apr. 1998 pp. 335-348.

R.J. McElience and D.V. Sarwate, "On Sharing Secrets and Reed-Solomon Codes," Communications of the ACM, Sep. 1981 vol. 24.

Adi Shamir, "How to Share a Secret ," Communications of the ACM, Nov. 1979, vol. 22, No. 11 pp. 612-613.

C.A. Asmuth and G.R. Blakley, "Proceedings of the 1982 Symposium on Security and Privacy," IEEE Computer Society, Apr. 25-26, 1982 Oakland CA, pp. 156-169.

Ehud D. Karnin, et al. "On Secret Sharing Systems," IEEE Transactions on Information Theory, vol. IT-29, No. 1, Jan. 1983.

David, J.C. MacKay, "Information Theory, Inference, and Learning Algorithms," Cambridge University Press, 2003.

McAuley, Anthony J, "Reliable Broadband Communication Using A Burst Erasure Correcting Code," SIGCOMM '90 Symposium, Sep. 1990, p. 297-306.

Miller, C Kenneth, "Reliable Multicast Protocols: A Practical View", Local Computer Networks Conference Proceedings, Nov. 1997, p. 369-378.

* cited by examiner

US 7,533,324 B2

SYSTEM, METHOD AND APPARATUS FOR FEC ENCODING AND DECODING

CROSS REFERENCE TO RELATED APPLICATIONS

This application claim priority to, and the benefit of, U.S. Provisional Patent Application Ser. No. 60/612,289 filed Sep. 22, 2004 which is hereby incorporated by reference in its entirety.

BACKGROUND OF THE INVENTION

1. Field of the Invention

The present invention relates to data coding and decoding and, more particularly, to systems and methods for forward error correction (FEC) coding and decoding to enable delivery of large digital files reliably to many remote sites at high speeds.

2. Description of the Related Art

Today, the availability of powerful digital computational tools has yielded the ability to present information in forms that go far beyond text and numbers. There now exists the capability to create and share data in more complex multimedia forms, using graphics, audio, still images and moving images (video), as well as combinations of those forms. Such data may be transferred from a host device, such as a host computer, to a potentially large number of subscriber devices, such as radio, television, mobile telephone, and computer devices.

One technique for transferring data is to broadcast it using one-way broadcasting systems such as satellite broadcasting systems. One notable drawback of one-way satellite broadcast systems, however, as compared to some other methods of information distribution such as computer networks, is the inability of the subscriber devices to inform the host device that a reception error has occurred. Thus, it is essential that the transferred data be transferred in such a way that all of the subscriber devices can recover from reception errors to avoid such problems.

The above drawback of one-way broadcasting (e.g., satellite broadcasting) is further compounded by the greater vulnerability of the broadcast signal to various forms of noise interference present in the transmission channel. One form of noise that is always present in the communications channel is "white" noise. For example, white noise is introduced in the channel by the thermal radiation of the gaseous constituents of the earth's surface. The strength and frequency of this noise varies, and it sometimes overpowers the transmitted signal causing it to be received erroneously. Because of white noise, a transmitted binary "zero" bit is occasionally received erroneously as a binary "one" bit, and vice-versa. Such errors are known as bit errors. White noise generally tends to cause isolated bit errors in a transmitted message. Although these bit errors are usually spread out throughout the message, they can be easily detected and corrected, because they are isolated.

In contrast with white noise, "impulse" noise tends to wipe out long sequences of consecutive bits. Such errors are known as "burst" errors. Their duration varies from a few milliseconds to a few seconds, but certain phenomena, such as rainstorms or sunspots, can cause burst errors of even longer duration such as a few minutes. Unlike bit errors due to white noise, burst errors are not distributed over the entire message, but only a portion thereof. However, burst errors are more difficult to detect and correct, because they wipe out so many consecutive bits of data.

Well-known error detection and correction (EDAC) schemes are used to reduce the effects of errors caused by white noise. EDAC schemes generally operate at the bit level by adding enough redundant data bits to the data to detect and correct the received data. In practice, EDAC schemes can only detect and correct a limited amount of bit errors. The redundant data added to the original data, however, obviously increases the amount of data to be transmitted and thus the transmission bandwidth and transmission time. Well-known EDAC schemes include Hamming, Viturbi, Reed-Solomon, and other forward error correction (FEC) coding schemes.

Interleaving may also be performed at the bit level. Interleaving rearranges the data bits so that they are non-sequentially transmitted. The subscriber device deinterleaves the received bits to reorder the bits as they originally appeared. This technique reduces the effect of errors in a sequence of bits. Although interleaving does not in itself correct those bit errors, by non-sequentially reordering the data bits in a block of data that is to be transmitted by the host device, the bit errors are more uniformly distributed over the received block of data upon deinterleaving by the subscriber device. By isolating the bit errors, interleaving enhances bit-level EDAC coding performance. Both EDAC and interleaving can also be performed on data symbols representing groups of bits, such as bytes.

In most broadcast systems, the transmitted data bits or symbols are most likely to be organized into large groups called packets, and a large data file is transmitted as a sequence of packets. The addressed subscriber devices reconstruct the large data file from the received packets. The above-described noise bursts can typically damage one or more long sequences of consecutive packets. Those packets are either not received by one or more of the subscriber devices or are received severely corrupted. Although bit-level EDAC schemes might be able to correct some of the corrupted packets, depending on the number of erroneous bits in those corrupted packets, these schemes are simply not robust enough to correct the great majority of those corrupted packets. This is because, in extended periods of burst noise, a large amount of both the original data bits and redundant EDAC bits in a packet are received corrupted, thus making bit-level error correction, and thus packet-level error-correction, impossible. Moreover, EDAC schemes are useless in the case of those packets not received.

One known method for reducing the effect of burst errors in such broadcast systems is retransmission of those packets that were not received or were received corrupted and could not be corrected (hereinafter those packets are simply referred to as "lost"). For example, a host device may broadcast via satellite to two geographically widely-separated subscriber devices A and B. Due to this wide separation, subscriber device A and subscriber device B may experience different weather conditions, and thus different patterns of noise. For example, subscriber device A may lose 20% of the transmitted packets, while subscriber computer B may successfully receive all the transmitted packets. Although it is possible to rebroadcast an entire file of data to all the subscriber devices, current methods of doing this are costly, waste time and bandwidth, and prevent communications channels from being used for other purposes. In the above example, subscriber device A would identify the lost packets (by examining the serial numbers of the correctly received packets) and would ask the host device to retransmit the packets it missed until the entire large data file could be reconstructed perfectly by subscriber computer A. In the satellite broadcast example given above, the request for missed packet retransmission is made through a back channel, and the host device rebroadcasts those missed packets via the satellite. Alternatively, the host device retransmits those missed packets only to subscriber device A through the back channel.

Retransmission of lost packets requires, however, (1) two-way communication back channels from all of the subscriber devices to the host device so each subscriber computer can inform the host device of which packets were lost, and (2) a retransmission protocol between the host device and the subscriber devices. Each back channel usually takes the form of a modem and telephone lines, or is part of a standard computer network. The back channel therefore has a limited bandwidth and can timely transmit only a limited amount of information. Back channels are also expensive. Further, retransmission increases the time required to distribute the data, and prevents the host device and subscriber devices from doing other tasks. In some applications, such as a mobile receiver, use of back channels may simply be impossible.

There have been some attempts to overcome these disadvantages. For example, low density parity-check codes, which use a randomized encoding matrix, have been used. As will be explained below, the codes used in the method of the present invention are generally not low density. Further, for decoding, as will also be shown below, the present invention uses Gaussian elimination rather than a potentially more efficient belief propagation that requires a low density assumption. In addition, Digital Fountain, Inc. has used codes which are said to address the burst-mode error channel discussed above. However, those codes, unlike the codes of the present invention as discussed below, are sparse.

The ability to communicate reliably is fundamental to any communications scheme. Therefore, it is desirable to provide a method and system for correction coding and decoding that overcomes the disadvantages noted above. There is also a need for a scheme for generating from a finite set of data an unbounded number of packets for transmission to a receiver, out of which any sufficiently large subset of those packets is sufficient to reconstruct an original source file.

SUMMARY OF THE INVENTION

In one aspect of the invention, a source file is encoded by dividing it into a plurality of shares comprised of a plurality of packets. A bit vector is generated. For at least one share, an FEC packet is generated by XOR'ing a subset of packets from the plurality of packets in the share in accordance with the bit vector. The process of encoding continues until terminated.

In another aspect of the present invention, once the FEC encoded packets are received, each of the plurality of packets which is not a linear combination of previously received packets is stored into a file. A sequence of XOR operations to perform in-place on the file to reconstruct the source file are generated and performed on the file.

These and other aspects of the invention are more fully discussed below.

BRIEF DESCRIPTION OF THE DRAWINGS

The various aspects of the present invention can be best understood by reference to the detailed description of the preferred embodiments set forth below taken with the drawings, in which.

DESCRIPTION OF PREFERRED EMBODIMENTS

The present invention is now described in more detail herein in terms of exemplary transmitter component for encoding a file into a sequence of packets and transmitting the same, and a receiver component for receiving and decoding those packets, or a subset thereof, to recover the original file in a one-way broadcast system environment. This is for convenience only and is not intended to limit the application of the present invention. In fact, after reading the following description, it will be apparent to one skilled in the relevant art(s) how to implement the following invention in alternative embodiments (e.g., bi-directional transmission environment).

Figure 1:
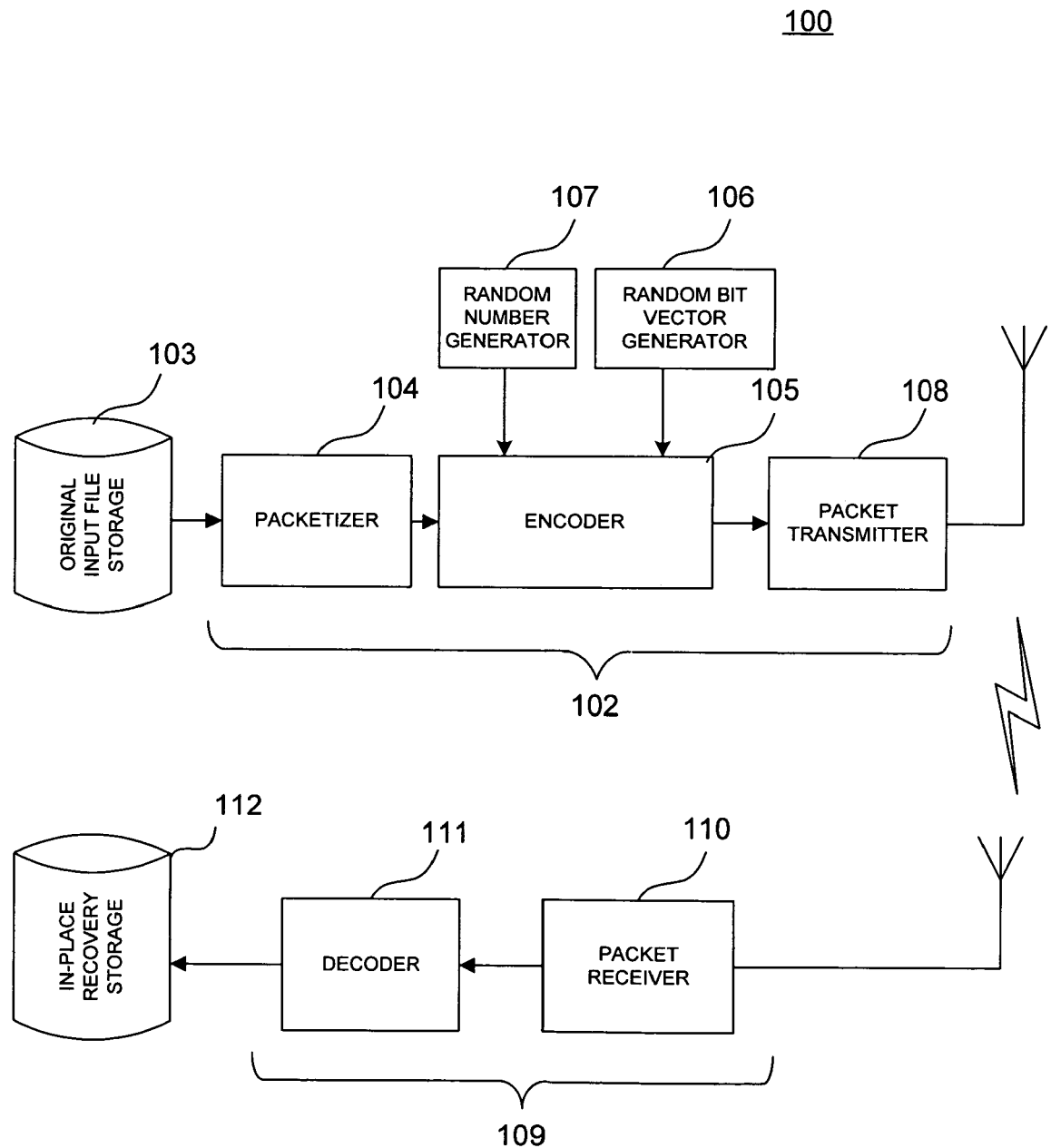
FIG. 1 depicts an exemplary embodiment of a communication scheme in accordance with the present invention.

FIG. 1 depicts an exemplary embodiment of a communication scheme 100 in accordance with the present invention. Transmitter component 102 receives data from a storage unit 103 in the form of an input file. The input file is fed to a packetizer 104 which packetizes the input file. In particular, packetizer 104 divides the source file into packets and collects the packets into groups of packets referred to herein as "shares". A bit vector generator 106 generates bit vectors. These bit vectors are used to determine which subset of packets within a share to XOR together to generate a forward error correction (FEC) packet. As will be described in more detail below, transmitter component 102 generates FEC packets for all the shares. Optionally, a random number generator 107 is fed to encoder 105 to randomly select for each round a particular share to start the encoding process. As each share in a round is encoded, they are transmitted by a packet transmitter 108. The source (or "original") data are thus encoded and transmitted to a receiver component 109.

Receiver component 109 reconstructs the file. A packet receiver 110 receives packets and stores each packet into a file in storage 112 if it is not linear combination of previously received packets. A decoder 111 generates a sequence of XOR operations and performs the operations in-place on the file to reconstruct the original input file.

Figure 2:
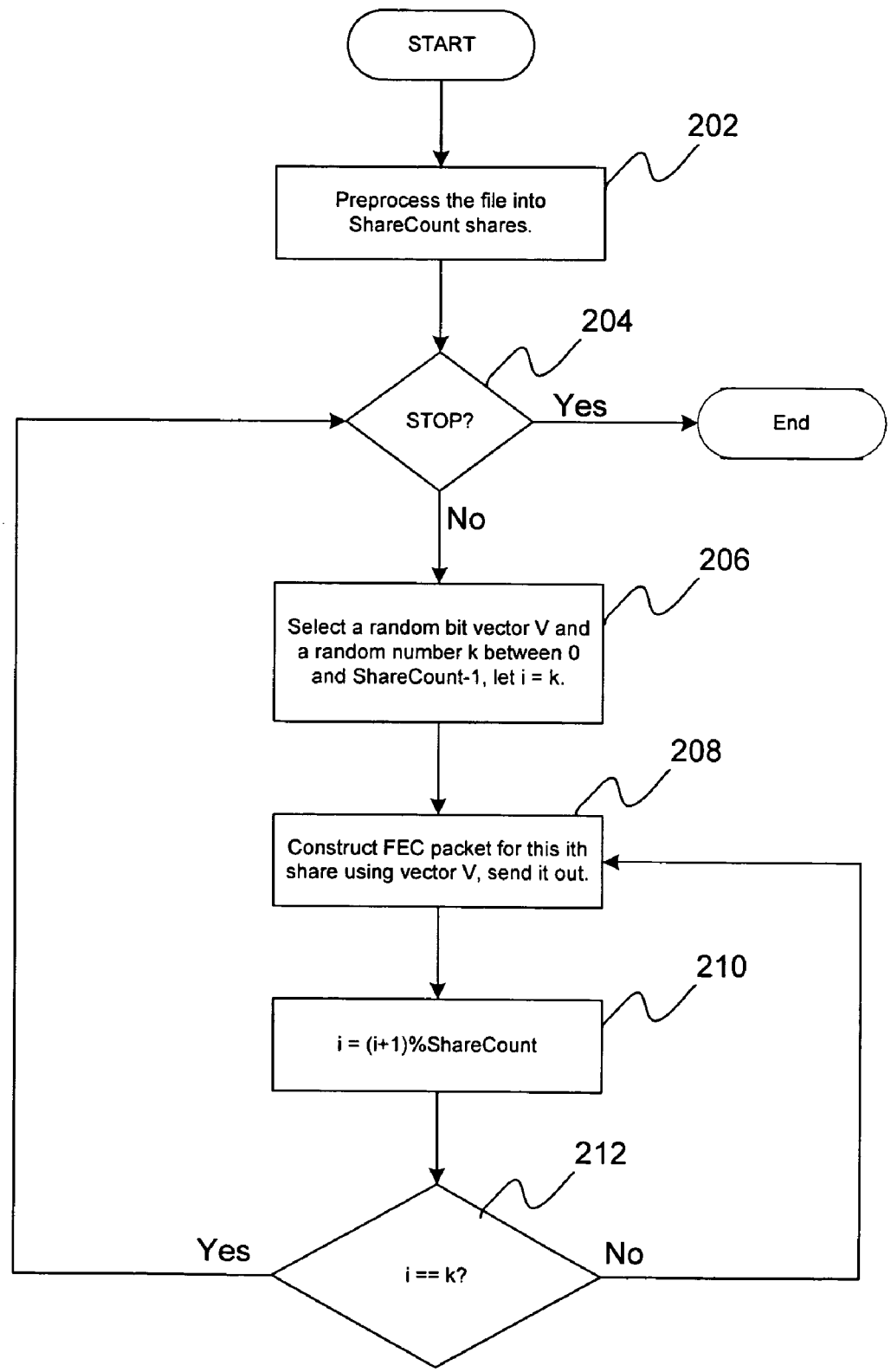
FIG. 2 depicts a flowchart illustrating a process executed by the transmitter component of a communication scheme, according to one embodiment of the present invention.

FIG. 2 depicts a flowchart illustrating a process 200 executed by the transmitter component 102 discussed above with respect to FIG. 1, according to one embodiment of the present invention. Initially, in step 202, packetizer 104 pre-processes a file into shares ("ShareCount" shares). In particular, packetizer 104 divides a file of finite length into packets of equal size, for example defined by a predetermined parameter. An exemplary packet size ("PacketSize") is 1024 bytes per packet. If the file cannot be divided evenly into the predetermined packet size (i.e., not enough data is available to fill the last packet), any unused portion of the packet is filled with zeros. The packets are further grouped into shares in accordance with another user defined parameter. An exemplary share size ("ShareSize") is 128 packets per share.

Typically, a first share consists of a first ShareSize number of packets, a second share consists of a second number of ShareSize packets and so on. Each share has ShareSize packets, except for the last share, which may have fewer packets if the total number of packets is not evenly divisible by Share-Size. The grouping of packets into shares is arbitrary. Typically, the shares are taken to consist of consecutive packets, since this is the most straightforward implementation, but any division of the packets of the file into shares would work equally well.

If the file is of size FileSize bytes, then the number of packets generated from the file, FilePacketCount, is defined as:

FilePacketCount=(FileSize+PacketSize−1)/PacketSize  (1)

It may be the case that the total number of packets does not divide evenly. Accordingly, the last share may contain fewer packets than the other shares.

Shares are processed in a round-robin fashion using random number generator 107 to choose the first share in a round. The number of shares in a round, ShareCount, is defined as:

ShareCount=(FilePacketCount+ShareSize−1)/ShareSize.  (2)

FilePacketCount, FileSize, PacketSize, ShareCount, and ShareSize are all integers and the divisions in (1) and (2) are integer divisions, with any remainder discarded.

After the shares have been generated, at step 206, encoder 105 selects a starting share from among all of the shares using a randomly (or pseudorandomly) generated value generated by random number generator 107. This value is different from the "random bit vector" generated by random bit vector generator 106 discussed below. At step 208, encoder 105 generates an encoded packet ("hereinafter referred to as an "FEC packet") by XORing certain packets in the starting share in accordance with the random bit vector generated by random bit vector generator 106, as discussed in more detail below, and once the FEC packet is generated, it is transmitted by packet transmitter 108.

The encoder 105 then proceeds to the next share and generates another FEC packet, and then to the next share, etc., until each share has been encoded as shown in steps 210 and 212. This processing can be performed in a round-robin fashion by starting with a first share and continuing to the next share, and so on, until the starting share has been reached again. For example, if ShareCount is 50, and the starting share is randomly determined to be 38, the shares are processed as follows: 38, 39, 40 . . . 49, 0, 1, 2, 3, . . . 35, 36, and 37. For each round, another, usually different, first share is selected in accordance with a newly-generated random (or pseudorandom) value. Continuing the above example, if the new started share is randomly determined to be 8, the shares in the second round would be processed as follows: 8, 9, 10, . . . , 49, 0, 1, 2, 3, 4, 5, 6, and 7.

Multiple rounds of encoding are required for each share because the output of each round contains only a small percentage of the information in each share. In general, there is no fixed limit on the number of rounds of encoding to be performed by the transmitter component 102.

Alternatively, the shares could be processed in a different order. For example, the shares can be selected within each round on a pseudorandom or random basis.

Many receiver components 109 may receive the packets generated by one transmitter component 102. In some applications, the receiver component 109 will receive the packets in a one-way manner, with no opportunity to send information back to the transmitter component 102. In these applications, there can be no way to guarantee that the receiver component 109 will receive sufficient information to decode the transmission. Typically, the transmitter component 102 will be configured to process sufficient rounds so that the population of receiver components 109 should have a reasonable probability of receiving enough data to decode the transmission, given any available information about the times that the receiver components 109 will be running and the expected packet losses during transmission.

If a determination is made at step 212 that all of the shares in a round have been encoded, then a determination is made at step 204 whether to stop the encoding process. Transmitter component 102 also may be configured to encode a certain number of rounds (e.g., 1000), or to run for a certain period of time (five hours), or to run until stopped by some external process or input. The transmitter component 102 may also be configured to stop and start again at another time. It should be understood that other criteria for ending the share processing exist and are within the scope of the present invention.

In some applications, the receiver component 109 may have a mechanism to report successful decoding back to the transmitter component 102. In these applications, the transmitter component 102 could stop processing rounds when it has received a successful report from each receiver component 109.

Since a receiver component 109 cannot decode the transmitted packets until it has received for a given share a number of encoded packets at least as great as the number of original packets in the share, i.e., the ShareSize, the minimum number of rounds encoded by the transmitter component 102 should be at least equal to the ShareSize. However, the number of rounds will usually be greater than the ShareSize, to account for packet losses during transmission.

The random bit vector is randomly (or pseudorandomly) generated for each round independently of the packets and shares. Each share in a round is encoded based on the same random bit vector. In each subsequent round, a newly-generated random bit vector is used to encode the share packets for each share in the round.

A more detailed description of how the FEC packets are generated follows. As stated above, each share is encoded by XORing a subset of the packets in the share. In particular, a current share consists of "m" data packets, where "m" is equal to the ShareSize except for the last share which may have fewer packets. The particular packets to be XOR'd are chosen by the random bit vector. Particularly, the random bit vector has as many bits as there are packets in the share. Thus, if a share consists of 128 packets, the random bit vector will be 128 bits long, each bit corresponding to a packet in the share. All the packets corresponding to a set bit in the random bit vector are XOR'd. Each bit in the random bit vector has an equal probability of being set and is not based on the input file, or the packets, or the shares they have been divided into.

Each packet is defined as:

$P[i][j]$; where $i=0, 1, 2, \ldots [m-1]$; and $j=j$th byte in the packet.  (3)

The random bit vector for a current round is defined as:

$V=(v[0], v[1], \ldots, v[\text{ShareSize}-1])$; where $v[i]$ is either 0 or 1.  (4)

Each FEC packet is defined as:

$F[\text{PacketSize}]$.  (5)

For each share, the FEC packet F is initialized to zero. Next, for each packet in a share, a test is made on the corresponding bit in the random bit vector V. If the corresponding bit is set, then the current packet is XOR'd with the current FEC packet. The steps discussed above are illustrated in the following C++ code segment:

```
char F[PacketSize];
//initialize F to 0;
memset(F, 0, PacketSize);
for (int i=0; i<m; i++)
```

```
    {
        if (v[i] = = 1) //is bit in random bit vector set?
        {
            for (int j=0; j<PacketSize; j++)
                F[j] ^= P[i][j]; //XOR current packet with FEC
packet.
        }
    }
}
```

The operator "^" is bit-wise XOR operation (that is, each bit of byte j is XOR'd).

Each round of operation on a share generates an FEC packet which is a linear combination of the source information. For each round, in general, different packets in a share are XOR'd based on different random bit vectors. (While extremely rare, it is possible for two rounds to have and utilize the same random bit vector.)

Each transmitted FEC packet includes a header in addition to the data described above. The header includes a field, ShareID, to denote which share the FEC packet belongs. The header also includes a field containing the random bit vector discussed above with respect to the encoder.

Instead of storing the entire random bit vector, other techniques can be used to pass the random bit vector information to the decoder component. For example a pseudorandom number generator can be included in both the encoder and decoder components. Only the pseudorandom number generator's seed value for the random bit vector is needed to recover the random bit vector at the receiver side.

In the above description, the same random bit vector is used for each share within a given round. Alternatively, a different random bit vector could be chosen for each of those shares within a round (i.e., for each transmitted FEC packet).

Figure 3:
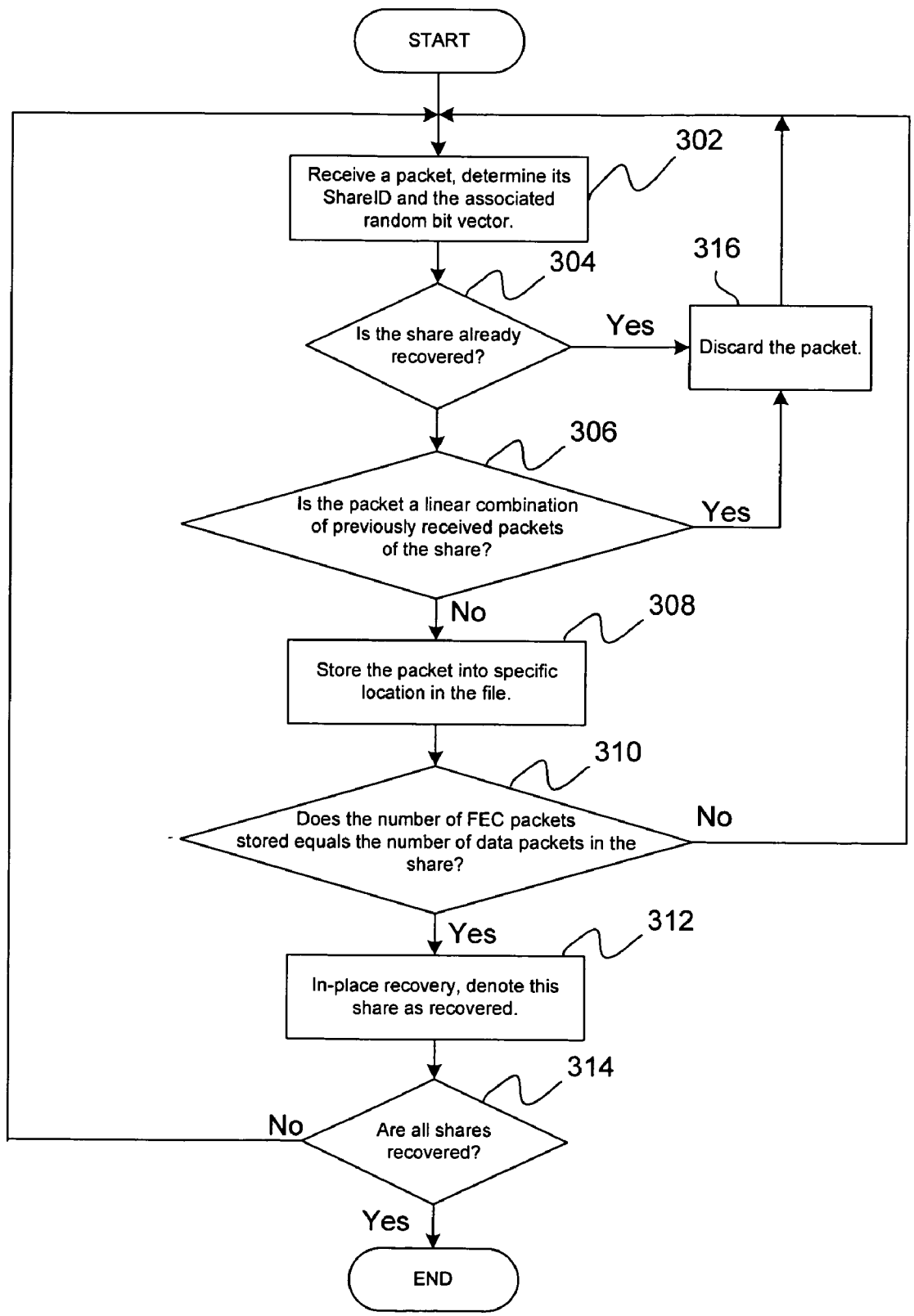
FIG. 3 depicts a flowchart illustrating a process executed by the receiver component of a communication scheme, according to one embodiment of the present invention.

FIG. 3 depicts a flowchart illustrating a process 300 executed by the receiver component 109 discussed above with respect to FIG. 1. Generally, packet receiver 110 may receive only a small subset of the packets transmitted by transmitter component 102. For example, the receiver component 109 may be started long after the transmitter component 102 has started, or the receiver component 109 may be turned on and off many times before receiving enough packets to reconstruct the original file. Packets may also be lost in transmission when the receiver is operating. After enough FEC packets corresponding to a share have been collected, the receiver extracts the file information from the collection of FEC packets. The extraction is based on a matrix inversion technique. As described above, for each round, generally a different bit vector is used for each round of encoding.

Referring to FIG. 3, at step 302, when an FEC packet is received by packet receiver 110, its bit vector is determined. As described above, the header includes a field, ShareID, to denote to which share the packet belongs. This ShareID is also extracted at step 302.

A determination is made at step 304 whether the share has already been recovered. If so, then at step 316 the packet is discarded. Some FEC packets may contain random bit vectors that are redundant and thus add no additional useful information. A random bit vector that is a linear combination of previously received random bit vectors is redundant. A determination is made at step 306 whether a redundant vector is received. If so, at step 316 the entire packet is discarded.

The determination process uses an augmented matrix for each share, described in more detail below. The random bit vector is stored in an augmented matrix (e.g., a rectangular matrix), which is then manipulated. For non-redundant bit vectors, this manipulation process results in a pivot position, which together with the ShareID, is used to determine the position in which to store the packet in the file. As subsequent FEC packets are received, their corresponding random bit vectors are added to the augmented matrix thereby increasing the augmented matrix size. The size of the augmented matrix determines whether enough FEC packets have been received to recover a corresponding share.

A determination is made at step 310 whether the number of received packets received and stored equals the number of data packets in a share. If not, then process 300 repeats and the packet receiver 110 awaits reception of another packet. If so, then at step 312 operations are performed in-place on the file to reconstruct the source file. If all the shares have been recovered, then process 300 ends. Otherwise process 300 repeats.

An exemplary embodiment of receiver component 109 will now be described in more detail. Generally, receiver component 109 uses a variation of the well-known Gaussian Elimination technique to reconstruct the encoded file information. Notably, the technique implemented by the FEC module allows data to be decoded in place without writing data to a temporary storage space, thereby eliminating the need for additional storage. In addition, the number of FEC packets stored in the receiver module need only be the same as the number of packets in the original file.

A matrix, BitV, is defined as the augmented matrix having 128 rows and 256 columns, where each element in the matrix is a bit. Each share has its own corresponding BitV matrix, each of which processed independently. Each row is accessed in terms of its left side (or first 128 bits) and right side (or second 128 bits).

Upon receipt of a packet the random bit vector is extracted and stored in a memory space V. The right side of the current row of the augmented matrix BitV is initialized to all zeros and the random bit vector stored in V is copied to the left side of the current row of the augmented matrix BitV.

Next a redundancy check is performed to determine whether the current packet is a linear combination of the previously received packets. If the packet is a linear combination of the previous received packets, then its information is redundant and therefore the entire packet may be discarded. A counter, Count, keeps track of how many useful packets have been received. A Pivot array stores the position of the first non-zero bit of each row of the augmented matrix.

The redundancy routine processes each packet in a share as follows. For each non-zero bit in the random bit vector of the current packet corresponding to a previously defined pivot, the row containing that pivot is XOR'd with the current row of the augmented matrix. Next, a function called FindPivot is used to return a non zero bit position in the first 128 bits, which is stored in a variable "pivot". If a non-zero bit does not exist, the packet is a linear combination of the previous received packets, and is thus deemed redundant and discarded.

In addition to determining whether the packet is useful, the pivot number also gives the position where the FEC packet data will be stored. In particular, the pivot position is multiplied by the packet size and added to an offset, ShareOffset, to become the offset ("Offset") within the file being constructed in the receiver component 109. The first ShareSize packets in the file that is being constructed in the receiver component 109 correspond to the first share of the original source file, and subsequent ShareSize packets correspond to subsequent shares of the original source file.

The data appended to each incoming packet that is determined to be useful is stored. A storage space for storing the original file is defined, and pointed to by *FileBeginPointer. The exact location of the data is the *FileBeginPointer position plus the Offset value.

If the receiver component 109 has stored a number of packets equal to the number of packets in the share, the function InPlaceRecover( ) is called. This function recovers the data in place without the need for additional storage space. Notably, InPlaceRecover( ) operates on a per-share basis and performs decoding in-place.

The details of the InPlaceRecover( ) function will now be described in more detail. The process counts down from the last row in the augmented matrix, which is a set of bits addressed using a variable "j". Initially, the left half of the augmented matrix is added (i.e., XOR'd) to the right half of the matrix. After the addition, the first 128 bits remain the same and the second 128 bits becomes the sum of the two vectors. After the left half of the augmented matrix has been added to the right half, the right side of the matrix is used for in-place recovery. Essentially, the bits remaining on the right half of the matrix are the instructions for reconstructing the data in the share. The instructions are in the form of bits in a vector. Each row of bits in the right side of the matrix determines which data packets to XOR. The result of the XOR operation is a reconstructed data packet.

When processing the ith row, each bit of the ith row of the right side of the augmented matrix is tested. For each bit that is set, the corresponding data packet is then XOR'd with the data which is at the position corresponding with the ith pivot, (i.e., Pivot[i]). As stated above, the pivots stored in array Pivot[i] correspond to the position where the ith incoming packet was originally stored. Each data packet corresponding to the original file is decoded in-place until the entire file has been reconstructed.

It is well known to those skilled in the art that a sequence of n+m uniformly distributed random length-n bit vectors is likely to contain a linearly independent subset of size n for relatively small m. A set of k linearly independent bit vectors spans a subspace of size 2^k. Since the whole vector space has size 2^n, then the probability that the next random bit vector is linearly independent of the first k is 1−(½)^(n−k). This probability is very close to 1 until k gets close to n. Thus, the expected number of random bit vectors needed to get a linearly independent set of size n is only slightly larger than n. This is one reason why the codes of the present invention work well with a relatively small amount of error protection.

The steps discussed above are illustrated in the following C++ code segment which can be implemented on a computer usable medium:

```
        //pointing to a storage of size (Packetsize * FilePacketCount);
        char *FileBeginPointer;
    prepare for the share:
        //this share starting position in the storage
        DWORD ShareOffset;
        DWORD ShareID;
        DWORD Count; // number of useful packets that have been
received
        DWORD Offset[128];
        DWORD Pivot[128];
        DWORD BitV[128][8];
        //ShareID denote the share, starting from 0 for the first share
        ShareOffset = ShareSize * PacketSize * ShareID;
        Count = 0;
//process incoming packet for this share, the incoming packet has
following
information
        {
            DWORD ShareID; //which share it belongs to
```

```
            DWORD V[4]; //the bit vector to construct this FEC packet
            char data[PacketSize];
        }
    //pseudo-code for incoming packet processing
    if (Count == 128) //has enough packets to recover
            return CONTINUE;
    memset(BitV[Count] + 4, 0, 16);
    memcpy(BitV[Count], V, 16);
    //check redundant
    for (int i=0; i<Count; i++)
    {
            if (IsSet(BitV[Count], Pivot[i])) //check pivot position
            {
                for (intj=0; j<8; j++)
                    BitV[Count][j] ^= BitV[i][j];
            }
    }
    //find first non zero bit in the first 128 bits
    int pivot = FindPivot(BitV[Count]);
    if (pivot = = −1) //no non-zero bit, redundant packet
            return CONTINUE;
    SetBit(BitV[Count] + 4, pivot); //set pivot in augmented matrix
    Pivot[Count] = pivot;
    Offset[Count] = ShareOffset + pivot * PacketSize;
    //copy the data to its destination
    memcpy(FileBeginPointer + Offset[Count], data, PacketSize);
    //increase count
    Count++;
    //file ready to recover?
    if (every share has enough packets to recover)
    {
            InPlaceRecover( );
            return DONE;
    }
    else return CONTINUE;
//C++ code for in-place recovery
InPlaceRecover( ) //illustrate for one share with share size 128
{
    int i, j, k;
    for (i=0; i<128; i++)
    {
        for (j=0; j<4; j++)
            BitV[i][4+j] ^= BitV[i][j];
    }
    for (i=127; i>=0; i−−)
    {
        char *pd, *ps;
        pd = FileBeginPointer + Offset[i];
        for(j=0; j<128; j++)
        {
            if(IsSet(BitV[i] + 4, j))
            {
                ps = FileBeginPointer + ShareOffset + j * Packetsize;
                for (k=0; k<PacketSize; k++)
                    pd[k] ^= ps[k];
            }
        }
    }
}
```

The following is an example of how the FEC module can be used to send software updates via satellite to computer devices in automobiles. A typical file size in this application might be 200000 bytes (FileSize), and a typical packet size 1024 bytes (PacketSize). Such a file would therefore be broken into 196 packets (FilePacketCount). The last packet would have 320 bytes of data and be padded with zeroes. If ShareSize is defined to be 128 packets, then there would be two shares (ShareCount). The first share would contain 128 packets, and the second share would contain 68 packets. During each round, the transmitter component 102 sends one packet from the first share and one from the second share.

The receiver component 109 located within the device in the automobile receives packets only while it is turned on (e.g., when the automobile is running). Because the automobile may be driven under trees, bridges, tunnels, and the like, where satellite reception is not possible, many packets may be lost during transmission. The receiver component 109 will need to receive at least 128 useful packets for the first share and 68 useful packets for the second share before successful decoding is possible. Because the automobile may operate for only a few minutes per day, for example, when the driver is commuting to and from work, it might take several days to accumulate sufficient useful packets for successful decoding. In this scenario, the software update might be broadcast by the satellite transmitter over a week or two.

For an application such as the one described above, the decoding process can be restricted to specific times, for example, during device startup. That is, decoding need not take place immediately after sufficient data has arrived, but could be delayed to a more convenient time. Performing decoding and subsequent installation of software updates at the time of device startup can prevent interruptions in the usage of the device.

The present invention (i.e., transmitter component 102, receiver component 109, process 200, process 300 or any part(s) or function(s) thereof) may be implemented using hardware, software or a combination thereof. Useful machines for performing the operation of the present invention include general purpose digital computers, radio frequency (RF) components or similar devices. After reading this description, it will become apparent to a person skilled in the relevant art(s) how to implement the invention using other computer systems and/or architectures.

In this document, the terms "computer program medium" and "computer usable medium" are used to generally refer to media such as removable storage drive, a hard disk installed in hard disk drive. These computer program products provide software to computer system.

Computer programs (also referred to as computer control logic) are stored in memory. Computer programs may also be received via a communications interface. Such computer programs, when executed, enable the computer system to perform the features of the present invention, as discussed herein. In particular, the computer programs, when executed, enable a processor to perform the features of the present invention. Accordingly, such computer programs represent controllers of the computer system.

In another embodiment, the invention is implemented primarily in hardware using, for example, hardware components such as application specific integrated circuits (ASICs). Implementation of the hardware state machine so as to perform the functions described herein will be apparent to persons skilled in the relevant art(s).

In yet another embodiment, the invention is implemented using a combination of both hardware and software.

While various embodiments of the present invention have been described above, it should be understood that they have been presented by way of example, and not limitation. It will be apparent to persons killed in the relevant art(s) that various changes in form and detail can be made therein without departing form the spirit and scope of the present invention. Thus, the present invention should not be limited by any of the above described exemplary embodiments, but should be defined only in accordance with the following claims and their equivalents. It is also to be understood that the steps and processes recited in the claims need not be performed in the order presented.

What is claimed is:

1. A method for encoding a source file to be transmitted to a receiver, comprising the steps of:
   (a) dividing the source file into a plurality of shares comprised of a plurality of packets;
   (b) generating a bit vector;
   (c) for at least one share, generating an FEC packet by XOR'ing a subset of packets from the plurality of packets in the share in accordance with the bit vector; and
   (d) repeating steps (b) and (c).

2. The method according to claim 1, wherein the bit vector is at least one of a random bit vector and a pseudorandom bit vector.

3. The method according to claim 1, wherein for two or more shares processed in step (c), the shares are processed in a round-robin fashion and a starting share is randomly selected.

4. The method according to claim 1, wherein step (d) is repeated for a predetermined time.

5. The method according to claim 1, wherein step (d) is repeated for a predetermined number of rounds.

6. The method according to claim 1, wherein step (d) is repeated until a user defined trigger is set.

7. An FEC encoder for encoding a source file to be transmitted to a receiver, comprising:
   a packetizer operable to divide the source file into a plurality of shares comprised of a plurality of packets;
   a bit vector generator operable to generate a bit vector; and
   an encoder operable to, for at least one share, generate an FEC packet by XOR'ing a subset of packets from the plurality of packets in the share in accordance with the bit vector.

8. The FEC encoder according to claim 7, wherein the bit vector is at least one of a random bit vector and a pseudorandom bit vector.

9. The FEC encoder according to claim 7, wherein for two or more shares, the encoder processes the shares in a round-robin fashion and a starting share is randomly selected.

10. The FEC encoder according to claim 7, further comprising:
    a timer operable to control how long FEC packets are generated.

11. The FEC encoder according to claim 7, further comprising:
    a counter operable to control how many FEC packets are generated.

12. The FEC encoder according to claim 7, further comprising:
    a triggering unit operable to control how many FEC packets are generated in accordance with a user defined triggering event.

13. An apparatus for encoding a source file to be transmitted to a receiver, comprising:
    means for dividing the source file into a plurality of shares comprised of a plurality of packets;
    means for generating a bit vector;
    means for generating, from at least one share, an FEC packet by XOR'ing a subset of packets from the plurality of packets in the share in accordance with the bit vector; and
    means for controlling how long FEC packets are generated.

14. A computer program product comprising a computer usable medium having control logic stored therein for causing a computer to encode a source file to be transmitted to a receiver, said control logic comprising:
    first computer readable program code for causing the computer to divide the source file into a plurality of shares comprised of a plurality of packets;
    second computer readable program code for causing the computer to generate a bit vector;

third computer readable program code for causing the computer to, for at least one share, generate an FEC packet by XOR'ing a subset of packets from the plurality of packets in the share in accordance with the bit vector; and fourth computer readable program code for causing the computer to repeat the second and third computer readable program code.

15. The computer program product of claim 14, wherein the bit vector is at least one of a random bit vector and a pseudorandom bit vector.

16. The computer program product of claim 14, wherein for two or more shares processed by the third computer readable program code, the third computer readable program code processes the shares in a round-robin fashion and randomly selects a starting share.

17. The computer program product of claim 14, further comprising:
fifth computer readable program code for causing the computer to repeat the fourth computer readable program code for a predetermined time.

18. The computer program product of claim 14, further comprising:
fifth computer readable program code for causing the computer to repeat the fourth computer readable program code for a predetermined number of rounds.

19. The computer program product of claim 14, further comprising:
fifth computer readable program code for causing the computer to repeat the fourth computer readable program code until a user defined trigger is set.

* * * * *